(12) United States Patent
Huang et al.

(10) Patent No.: US 8,546,069 B2
(45) Date of Patent: Oct. 1, 2013

(54) METHOD FOR ENHANCING LITHOGRAPHIC IMAGING OF ISOLATED AND SEMI-ISOLATED FEATURES

(75) Inventors: Wu-Song Huang, Brewster, NY (US); Gregory R. McIntyre, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 1050 days.

(21) Appl. No.: 12/354,247

(22) Filed: Jan. 15, 2009

(65) Prior Publication Data

US 2010/0178619 A1    Jul. 15, 2010

(51) Int. Cl.
*G03F 7/40*    (2006.01)
(52) U.S. Cl.
USPC .......................... 430/325; 430/394; 430/330
(58) Field of Classification Search
USPC .......................................... 430/325, 330, 394
See application file for complete search history.

(56) References Cited

U.S. PATENT DOCUMENTS

| | | | |
|---|---|---|---|
| 6,545,338 B1 | 4/2003 | Bothra et al. | |
| 6,781,424 B2 | 8/2004 | Lee et al. | |
| 7,256,740 B2 | 8/2007 | Tinsley et al. | |
| 7,824,842 B2 * | 11/2010 | Finders | 430/313 |
| 8,158,014 B2 * | 4/2012 | Huang et al. | 216/41 |
| 2003/0122079 A1 | 7/2003 | Pobanz et al. | |
| 2004/0095277 A1 | 5/2004 | Mohamadi | |
| 2004/0095287 A1 | 5/2004 | Mohamadi | |
| 2004/0113220 A1 | 6/2004 | Rieve et al. | |
| 2004/0263393 A1 | 12/2004 | Lynch et al. | |
| 2006/0220961 A1 | 10/2006 | Tinsley et al. | |
| 2007/0262904 A1 | 11/2007 | Tinsley et al. | |

FOREIGN PATENT DOCUMENTS

| | | |
|---|---|---|
| WO | 00/16492 | 3/2000 |
| WO | 2006/105510 A1 | 10/2006 |

OTHER PUBLICATIONS

Titled, "Method for Reducing Side Lobe Printing Using A Barrier Layer", filed Dec. 3, 2007 U.S. Appl. No. 11/949,190.
Titled, "Photoresists and Methods for Optical Proximity Correction", filed Feb. 21, 2008 U.S. Appl. No. 12/035,009.

* cited by examiner

*Primary Examiner* — Daborah Chacko Davis
(74) *Attorney, Agent, or Firm* — Derek S. Jennings; Patent Mining Works, LLC

(57) ABSTRACT

The present invention relates to photolithography methods for enhancing lithographic imaging of isolated and semi-isolated features. A first layer of a first photoresist is formed over a substrate. A second layer of a second photoresist is formed over the first layer. The second photoresist includes a polymer containing an absorbing moiety. The second layer is exposed through a first patterned mask and developed to form a first relief image. The first relief image and the first layer are exposed through a second patterned mask. One of the first and the second patterned masks includes a dense pattern, while the other includes an isolated or a semi-isolated pattern. The first relief image and base soluble regions of the first layer are removed to form a second relief image with an isolated or a semi-isolated pattern. The second layer can also be bleach-able upon exposure and bake in the present invention.

15 Claims, 12 Drawing Sheets

METHOD FOR ENHANCING LITHOGRAPHIC IMAGING OF ISOLATED AND SEMI-ISOLATED FEATURES

FIELD OF THE INVENTION

This invention relates to a photolithography method for semiconductor fabrication. More particularly, this invention is directed to a method to enhance lithographic imaging of isolated and semi-isolated features in a photolithography process.

BACKGROUND OF THE INVENTION

Photolithography is commonly used to make miniaturized electronic components such as integrated circuits in semiconductor manufacturing. In a photolithography process, a layer of photoresist is deposited on a substrate, such as a silicon wafer. The substrate is baked to remove any solvent remained in the photoresist layer. The photoresist is then selectively exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution to remove either the exposed portions of the photoresist for a positive photoresist or the unexposed portions of the photoresist for a negative photoresist. The patterned photoresist can then be used as a mask for subsequent fabrication processes on the substrate, such as deposition, etching, or ion implantation processes.

In a photolithography process, dense patterns generally tend to have better process windows than isolated or semi-isolated patterns due to proximity effects. One approach to improve the process windows of isolated or semi-isolated features is to use sub-resolution assist features (SRAFs) in a single exposure process. Extensive simulation and modeling are needed to put SRAFs in a photomask. Manufacturing such photomasks is also complex and expensive. In addition, it is difficult to introduce partially transparent patterns at a specific complex pattern area on a photomask. Another approach is to use printed sub-resolution assist features (PRAFs) in a double exposure double etch process. However, in general, the double exposure double etch process is more costly than the single exposure process. Thus, there is a need to improve the process windows of isolated and semi-isolated patterns.

SUMMARY OF THE INVENTION

In one aspect, the present invention relates to a photolithography method for enhancing lithographic imaging of isolated and semi-isolated features involving the steps of forming a first layer of a first photoresist over a substrate, the first photoresist is photosensitive to a radiation having an imaging wavelength; forming a second layer of a second photoresist over the first layer, the second photoresist comprising a polymer containing an absorbing moiety rendering the polymer absorbing the radiation; exposing the second layer to a first dose of the radiation through a first patterned mask, the first patterned mask comprising a dense pattern; developing the second layer in an aqueous base solution to remove base soluble regions of the second layer and reveal sections of the first layer, wherein a first relief image is formed in the second layer, the first relief image comprising the dense pattern; exposing at least one such revealed section of the first layer to a second dose of the radiation through a second patterned mask, wherein the second patterned mask comprises an isolated or a semi-isolated pattern; and removing the first relief image and base soluble regions of the first layer to form a second relief image in the first layer, the second relief image comprising the isolated or semi-isolated pattern.

In another aspect, the present invention relates to a photolithography method for enhancing lithographic imaging of isolated and semi-isolated features involving the steps of forming a first layer of a first photoresist over a substrate, the first photoresist is photosensitive to a radiation having an imaging wavelength; forming a second layer of a second photoresist over the first layer, the second photoresist comprising a polymer containing an absorbing moiety rendering the polymer absorbing the radiation; exposing the second layer to a first dose of the radiation through a first patterned mask, the first patterned mask comprising an isolated or a semi-isolated pattern; developing the second layer in an aqueous base solution to remove base soluble regions of the second layer and reveal at least one section of the first layer, wherein a first relief image is formed in the second layer, the first relief image comprising the isolated or semi-isolated pattern; exposing the second layer and the revealed at least one section of the first layer to a second dose of the radiation through a second patterned mask, wherein the second patterned mask comprises a dense pattern; and removing the first relief image and base soluble regions of the first layer to form a second relief image in the first layer, the second relief image comprising the isolated or semi-isolated pattern.

In still another aspect, the present invention relates to a photolithography method for enhancing lithographic imaging of isolated and semi-isolated features involving the steps of forming a first layer of a first photoresist over a substrate, the first photoresist is photosensitive to a radiation having an imaging wavelength; forming a second layer of a second photoresist over the first layer, the second photoresist comprising a polymer containing an absorbing moiety rendering the polymer absorbing the radiation; exposing the second layer to a first dose of the radiation through a first patterned mask, the first patterned mask comprising a dense pattern; thermally treating the second layer at a first temperature to form bleached regions in the second layer, wherein the bleached regions of the second layer have substantially lower absorption than unbleached regions of the second layer at the imaging wavelength of the radiation; exposing the second layer and the first layer to a second dose of the radiation through a second patterned mask, wherein the second patterned mask comprises an isolated or a semi-isolated pattern and a fraction of the radiation passes through at least one such bleached region of the second layer, resulting in exposing at least one region of the first layer directly beneath the at least one such bleached region; and removing the second layer and base soluble regions of the first layer to form a second relief image in the first layer, the second relief image comprising the isolated or semi-isolated pattern.

In still another aspect, the present invention relates to a photolithography method for enhancing lithographic imaging of isolated and semi-isolated features involving the steps of forming a first layer of a first photoresist over a substrate, the first photoresist is photosensitive to a radiation having an imaging wavelength; forming a second layer of a second photoresist over the first layer, the second photoresist comprising a polymer containing an absorbing moiety rendering the polymer absorbing the radiation; exposing the second layer to a first dose of the radiation through a first patterned mask, the first patterned mask comprising an isolated or a semi-isolated pattern; thermally treating the second layer at a first temperature to form at least one bleached region in the second layer, wherein the at least one bleached region of the second layer has substantially lower absorption than unbleached regions of the second layer at the imaging wavelength of the radiation; exposing the second layer and the first layer to a second dose of the radiation through a second patterned mask, wherein the second patterned mask comprises a dense pattern and a fraction of the radiation passes through at least one such bleached region of the second layer, resulting in exposing at least one region of the first layer directly beneath the at least one such bleached region; and removing the second layer and base soluble regions of the first layer to form a second relief image in the first layer, the second relief image comprising the isolated or semi-isolated pattern.

The second layer preferably has an absorption parameter (k) greater than the k parameter of the first layer at the imaging wavelength of the radiation. It is preferred that the second layer has a k parameter in the range from about 0.05 to about 0.8 at the imaging wavelength of the radiation. The absorbing moiety is preferably selected from the group consisting of unsubstituted aromatic moieties and substituted aromatic moieties.

The isolated or semi-isolated pattern and the dense pattern preferably have a same pattern feature, but different pitches.

The first dose of the radiation is preferably lower than the second dose of the radiation.

It is also preferred that the imaging wavelength of the radiation is about 193 nm.

The photolithography method may further involve the step of transferring the second relief image into the substrate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1:
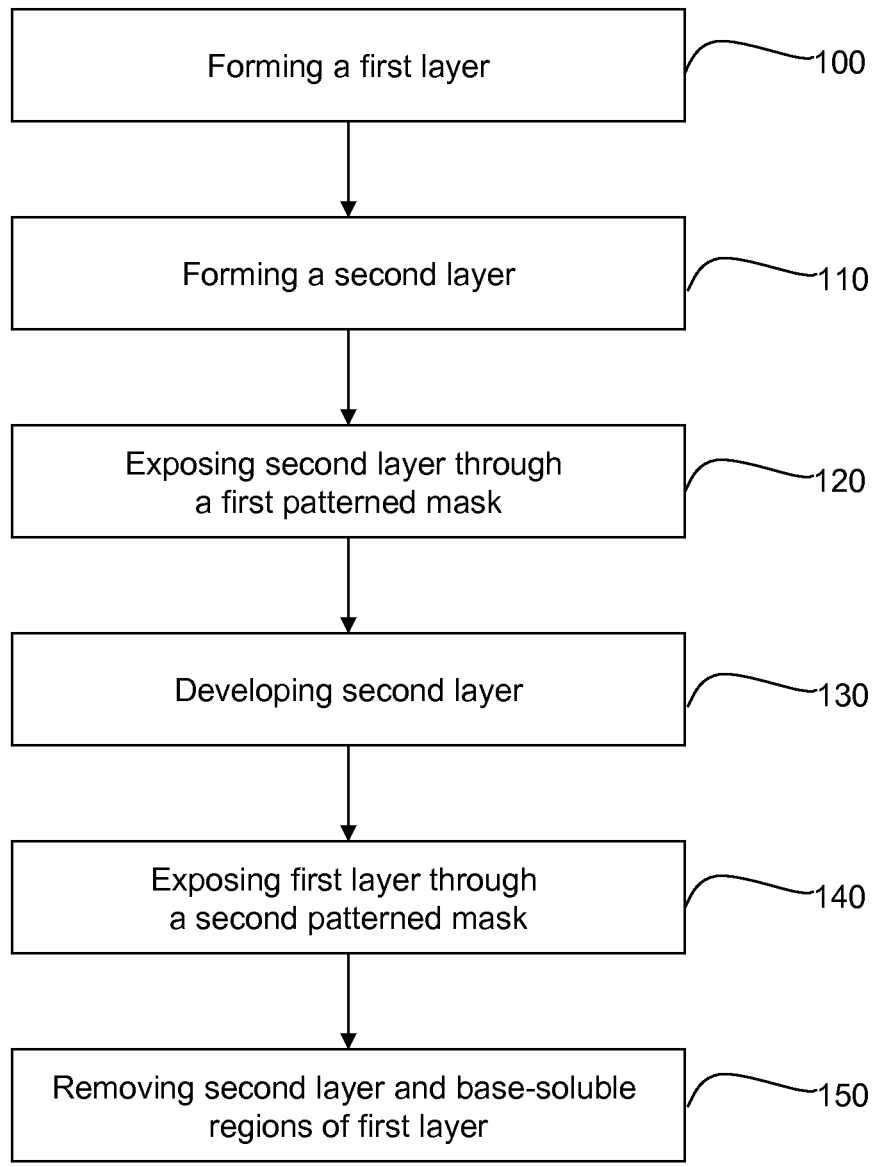
FIG. 1 is a flow chart illustrating a photolithography method, in accordance with embodiments of the present invention.

In describing the preferred embodiments of the present invention, reference will be made herein to FIGS. 1-6d of the drawings in which like numerals refer to like features of the invention. Features of the invention are not necessarily shown to scale in the drawings.

It will be understood that when a pattern is referred to as being "dense", the size of the pitch of such a pattern is less than 3 times of the size of the pattern feature. When a pattern is referred to as being "isolated", the size of the pitch is greater than 8 times of the size of the pattern feature. When a pattern is referred to as being "semi-isolated", the size of the pitch is from about 3 times to about 8 times of the size of the pattern feature.

The present invention provides a photolithography method for enhancing lithographic imaging of isolated and semi-isolated features using a double exposure track only (DETO) scheme. In other words, there is no etch step involved between the first and the second exposure steps. In this scheme, a first photoresist is formed on a substrate. An absorbing and low-dose photoresist (grey resist) is formed on top of the first photoresist. The grey resist is then exposed during a first exposure to a radiation through a first patterned mask, followed by development in a base developer or thermal treatment. The developed or thermally treated grey resist then acts as a filter for a second exposure to the underlying first photoresist through a second patterned mask. One of the first and second patterned masks includes a dense pattern. The other includes an isolated or a semi-isolated pattern. The dense pattern and the isolated or semi-isolated pattern may have a same pattern feature, but different pitches. The net effect is an improved lithographic imaging of the isolated or semi-isolated feature compared to the traditional single exposure scheme.

The grey resist is absorbing at the imaging wavelength of the exposures. It is preferred that the grey resist has an absorption parameter (k) greater than that of the underlying first photoresist at the imaging wavelength of the exposures. The absorption parameter k indicates the amount of absorption loss when an electromagnetic wave propagates through a material, such as a photoresist. The k parameter of the grey resist is preferably in the range from about 0.05 to about 0.8, more preferably in the range from about 0.08 to about 0.5 at the imaging wavelength of the exposures.

The grey resist includes a resist polymer with an absorbing moiety. The absorbing moiety of the resist polymer of the grey resist may be any chemical moieties that absorb radiation at the exposure wavelength. Preferably, the absorbing moiety includes, but is not limited to, unsubstituted and substituted aromatic moieties such as benzene, naphthalene, hydroxy-substituted benzene, and hydroxy-substituted naphthalene. Examples of the resist polymer of the grey resist include polymers containing polycyclic moieties commonly used in 193 nm photoresists and phenol groups commonly used in 248 nm photoresists. Specific examples of the grey resist polymer include, but are not limited to,

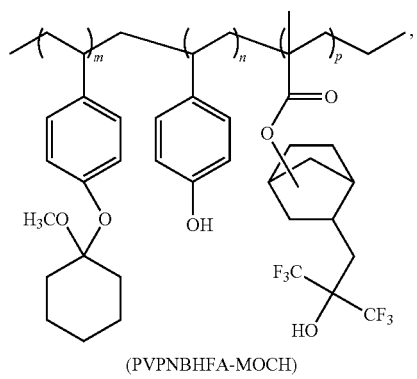

(PVPNBHFA-MOCH)

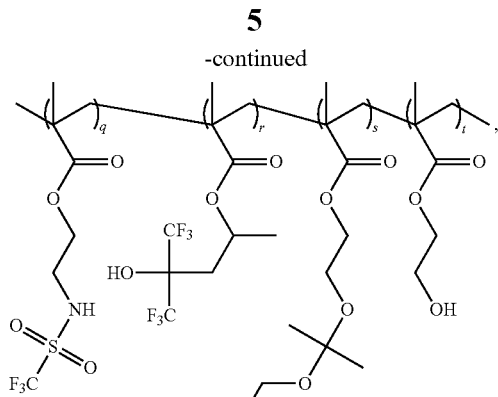

(HEMA-IPHFA-STAR-BOP)

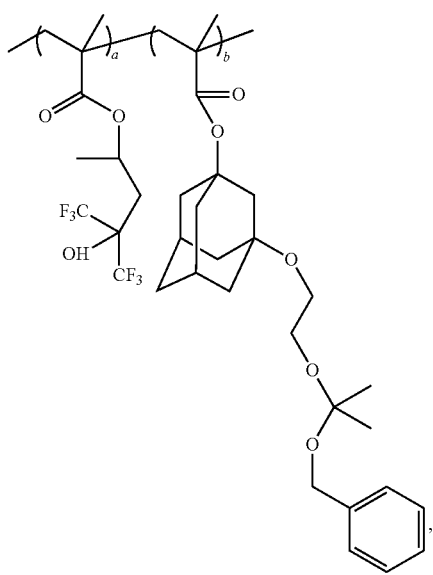

(IPHFA-HEAdMA-BOP)

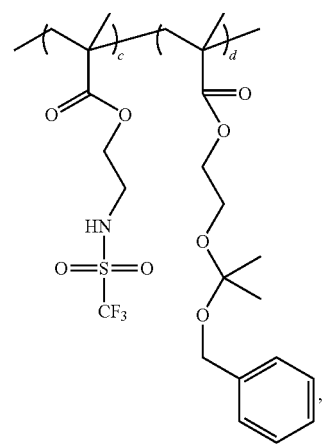

(STAR-HEMA-BOP)

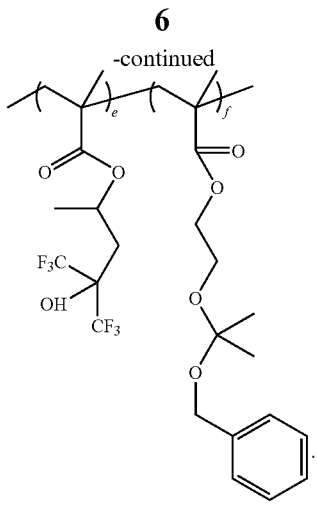

(IPHFA-HEMA-BOP)

where a, b, c, d, e, f, m, n, p, q, r, s and t are integers representing the number of repeating units, each independently ranging between 1 and about 500.

In addition to the resist polymer, the grey resist may further comprise a photoacid generator (PAG) and a solvent. The PAG described herein is capable of generating acid upon exposure to a radiation, such as visible, ultraviolet (UV), extreme ultraviolet (EUV) light. The PAG may comprise, for example, sulfonium salts, iodonium salts, sulfonic acid esters of N-hydroxyamides, imides, or combinations thereof. The solvent for the grey resist in the present invention is chosen such that it does not dissolve the underlying layer. Suitable solvents include, but are not limited to, 1-butanol, methanol, ethanol, 1-propanol, ethylene glycol, 1,2-butanediol, 1,3-butanediol, 1,4-butanediol, 1,2-propanediol, 1,3-propanediol, and 4-methyl-1-pentanol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, and decane. Preferably, the grey resist also contains a base quencher. The base quencher may comprise, for example, aliphatic amines, aromatic amines, carboxylates, hydroxides, or combinations thereof.

The grey resist is not limited to any specific proportions of the various components. The grey resist preferably comprises about 1% by weight (wt %) to about 15 wt % of the resist polymer based on the total weight of the resist composition, more preferably from about 2 wt % to about 10 wt %. The grey resist preferably comprises from about 0.5 wt % to about 10 wt % PAG based on the weight of the polymer in the composition, more preferably from about 1 wt % to about 5 wt %. The grey resist preferably comprises from about 85 wt % to about 99 wt. % solvent based on the total weight of the composition, more preferably from about 90 wt % to about 98 wt %. The grey resist preferably includes from about 0.1 wt % to about 2.0 wt % of base quencher based on the total weight of the polymer in the composition, more preferably from about 0.2 wt % to about 1.0 wt %.

FIG. 1 is a flow chart illustrating a photolithography method. Step 100 comprises forming a first layer of a first photoresist over a substrate. The substrate in the present invention is suitably any substrate conventionally used in processes involving photoresists. For example, the substrate can be silicon, silicon oxide, aluminum-aluminum oxide, gallium arsenide, ceramic, quartz, copper or any combination thereof including multilayers. The substrate may further contain an antireflective layer commonly used in conjunction with photoresists.

The first photoresist may be any photoresist conventionally used in semiconductor industry, including 193 nm and 248 nm photoresists. Both positive-tone resists and negative-tone resists are suitable to be used in the present invention. The first photoresist is photosensitive to a radiation having an imaging wavelength. The first layer may be formed by virtually any standard means including spin coating. The substrate with the first layer may be baked (post applying bake (PAB)) to remove any solvent from the first photoresist and improve the coherence of the first layer. The preferred range of the PAB temperature for the photoresist layer is from about 70° C. to about 150° C., more preferably from about 90° C. to about 130° C. The preferred range of thickness of the first layer is from about 20 nm to about 400 nm, more preferably from about 50 nm to about 300 nm.

Step 110 comprises forming a second layer of a second photoresist over the first layer. The second photoresist is a grey resist comprising a polymer containing an absorbing moiety which renders the polymer absorbing at the imaging wavelength of the radiation, as described above. Preferably, the grey resist is photoimageable with the same wavelength of light as the underlying first photoresist, and is also developable with an aqueous base developing solution typically used to develop photoresists. The substrate may be baked (PAB) to remove any solvent from the second photoresist and improve the coherence of the second layer. The preferred range of the PAB temperature for the second layer is from about 70° C. to about 150° C., more preferably from about 90° C. to about 130° C. The preferred range of thickness of the second layer is from about 10 nm to about 300 nm, more preferably from about 20 nm to about 100 nm.

Step 120 comprises exposing the second layer to a first dose of the radiation through a first patterned mask. In one embodiment, the first patterned mask comprises a dense pattern. In another embodiment, the first patterned mask comprises an isolated or a semi-isolated pattern. Because the second layer is absorbing at the wavelength of the radiation, a large fraction of the first dose is absorbed by the second layer. As a result, only a small fraction of the first dose reaches the underlying first layer, which is not enough to induce any chemical reaction in the first photoresist.

In Step 130, the second layer is developed in an aqueous base solution to remove base soluble regions of the second layer and form a first relief image in the second layer. The first relief image comprises the pattern in the first patterned mask. At least a section of the underlying first layer is revealed once the base soluble regions of the second layer are removed.

A post exposure bake (PEB) step may be performed after the second layer is exposed with the radiation and before it is developed. The preferred range of the PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

Step 140 comprises exposing the first layer to a second dose of the radiation through a second patterned mask. When the first patterned mask comprises a dense pattern, then the second patterned mask comprises an isolated or a semi-isolated pattern. On the other hand, when the first patterned mask comprises an isolated or a semi-isolated pattern, then the second patterned mask comprises a dense pattern. It is preferred that the dense pattern and isolated or semi-isolated pattern have a same pattern feature, but different pitches.

Step 150 comprises removing the first relief image and base soluble regions of the first layer to form a second relief in the first layer. The second relief image comprises the isolated or semi-isolated pattern contained in the first or the second patterned mask. It is preferred that the first relief image and base soluble regions of the first layer are removed in an aqueous base developer.

A PEB step may be performed after the first layer is exposed and before the first relief image and base soluble regions of the first layer are removed. When the first photoresist is a positive-tone resist, the PEB step may induce a deprotection reaction in the exposed regions of the first layer, rendering the exposed regions soluble in a base developer. When the first photoresist is a negative-tone resist, the PEB step may induce a crosslinking reaction in the exposed regions of the first layer and render the exposed regions insoluble in a base developer. The PEB step may further induce a chemical reaction in the first relief image, rendering the first image soluble in a base developer. The preferred range of the PEB temperature is from about 70° C. to about 140° C., more preferably from about 90° C. to about 130° C.

Figure 2A:
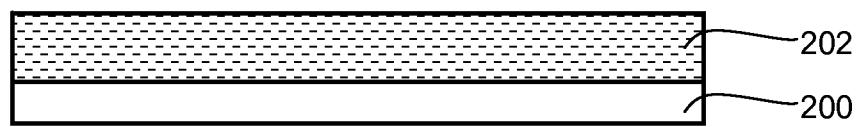
FIGS. 2a-2f illustrate exemplary processing steps of a photolithography method, in accordance with one embodiment of the present invention.
Figure 2B:
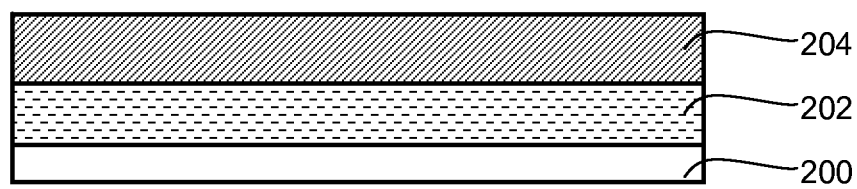

In FIG. 2a, a first photoresist is applied to a substrate 200 to form a first layer 202, such as described in Step 100 above. The first photoresist is photosensitive to a radiation having an imaging wavelength. FIG. 2b is an illustration of the substrate 200 after a second layer of a second photoresist 204 is formed over the first layer 202, such as described in Step 110 above. The second photoresist comprises a polymer containing an absorbing moiety rendering the polymer absorbing the radiation.

Figure 2C:
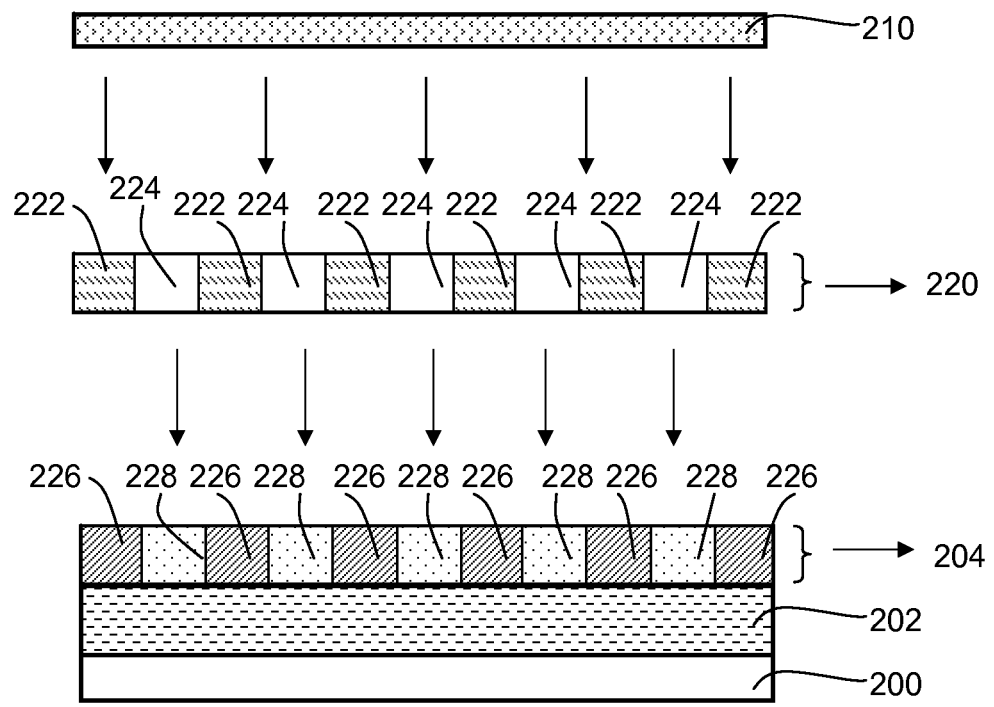

FIG. 2c illustrates the step of exposing the second layer 204 to a first dose of a radiation 210 through a first patterned mask 220 such as described in Step 120 above, according to one embodiment. The first patterned mask 220 comprises a dense pattern in which masked sections 222 are essentially opaque to the radiation or impenetrable to the energetic particles, and unmasked sections 224 are essentially transparent to the radiation or penetrable to the energetic particles. Radiation or particles passing through the unmasked sections 224 may be transmitted to the second layer 204 to be absorbed in the exposed regions 228 of the second layer 204, wherein the radiation or particles may induce the production of an acid in the exposed regions 228 of the second layer 204. Unexposed regions 226 of the second layer 204 may not produce an acid. Exposure to the radiation or energetic particles may render the exposed regions 228 soluble in a base developer.

Figure 2D:
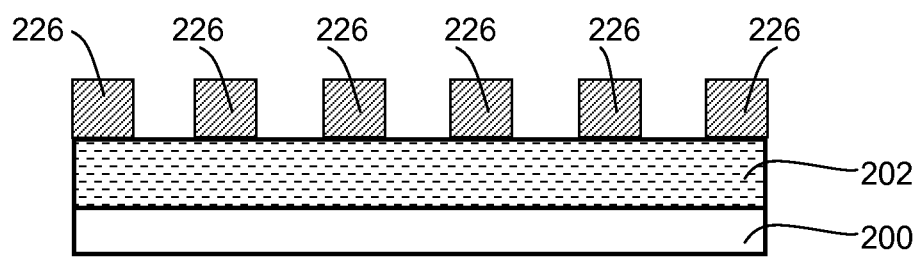

FIG. 2d is an illustration of the substrate 200 and the layers of FIG. 2c after developing the second layer 204 in an aqueous base solution to remove base soluble regions of the second layer and reveal sections of the underlying first layer such as described in Step 130 above, according to one embodiment. A first relief image 226 is formed in the second layer. The first relief image 226 comprises the dense pattern contained in the first patterned mask 220.

Figure 2E:
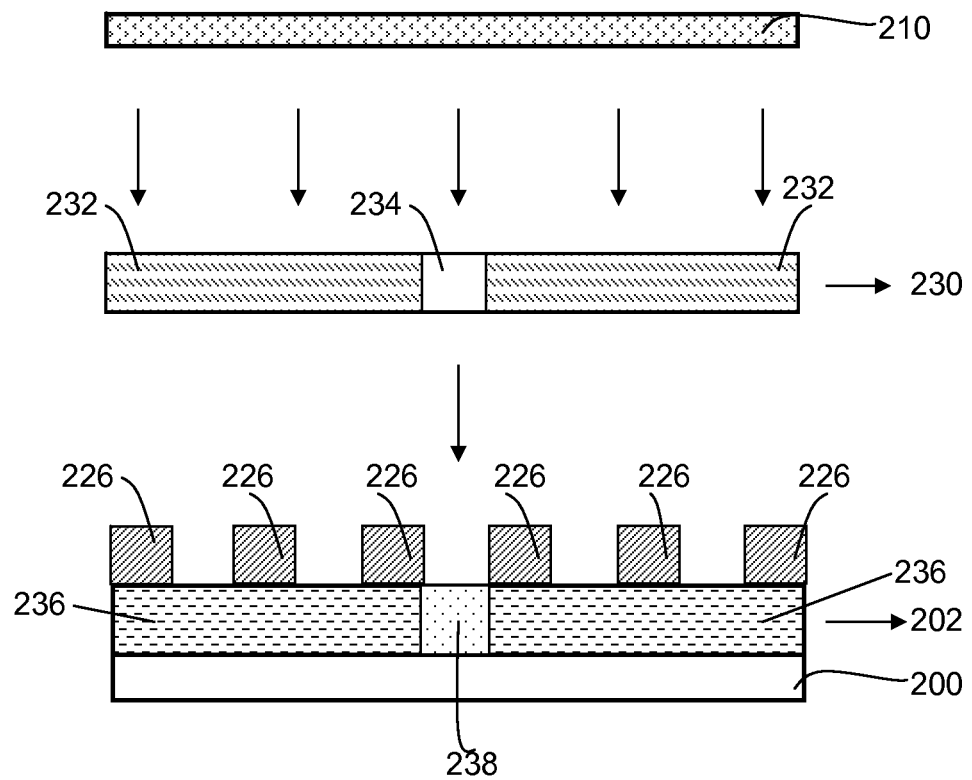

FIG. 2e illustrates the step of exposing at least one revealed section of the first layer to a second dose of the radiation 210 through a second patterned mask 230 such as described in Step 140 above, according to one embodiment. The second patterned mask 230 comprises an isolated pattern in which masked sections 232 are essentially opaque to the radiation or impenetrable to the energetic particles, and an unmasked section 234 is essentially transparent to the radiation or penetrable to the energetic particles. Radiation or particles passing through the unmasked section 234 may be transmitted to the first layer 202 to be absorbed in the exposed region 238, wherein the radiation or particles may induce the production of an acid in the exposed region 238 of the first layer 202. Unexposed regions 236 of the first layer 202 may not produce an acid. Exposure to the radiation or energetic particles may render the exposed region 238 soluble in a base developer. The second patterned mask 230 and the first patterned mask 220 in FIG. 2c may have a same pattern feature but different pitches, i.e., the unmasked section 234 of the second patterned mask 230 may have the same shape and size as the unmasked sections 224 of the first patterned mask 220 in FIG. 2c. The first dose of the radiation may be lower than the second dose of the radiation.

Figure 2F:
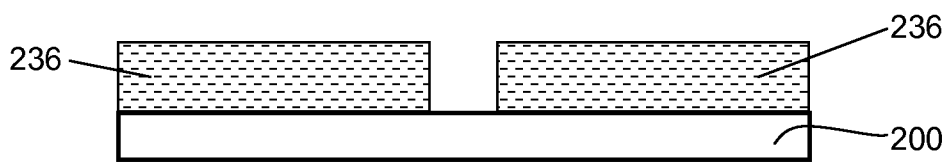

FIG. 2f is an illustration of the substrate 200 and the layers in FIG. 2e after the first relief image 226 and the base soluble region 238 are removed such as described in Step 150 above, according to one embodiment. A second relief image 236 is formed in the first layer after the removal. The second relief image 236 comprises the isolated pattern contained in the second patterned mask 230.

Figure 3A:
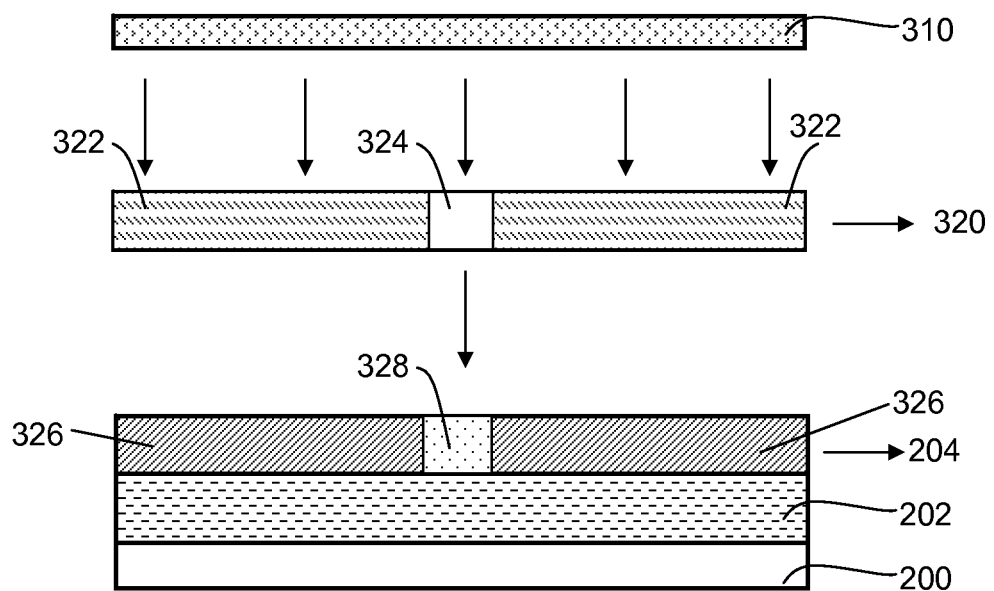
FIGS. 3a-3d illustrate exemplary processing steps of a photolithography method, in accordance with another embodiment of the present invention.

FIG. 3a illustrates the step of exposing the second layer 204 to a first dose of a radiation 310 through a first patterned mask 320 such as described in Step 120 above, according to another embodiment. The first patterned mask 320 comprises an isolated pattern in which masked sections 322 are essentially opaque to the radiation or impenetrable to the energetic particles, and an unmasked section 324 is essentially transparent to the radiation or penetrable to the energetic particles. Radiation or particles passing through the unmasked section 324 may be transmitted to the second layer 204 to be absorbed in the exposed region 328 of the second layer 204, wherein the radiation or particles may induce the production of an acid in the exposed region 328 of the second layer 204. Unexposed regions 326 of the second layer 204 may not produce an acid. Exposure to the radiation or energetic particles may render the exposed region 328 soluble in a base developer.

Figure 3B:
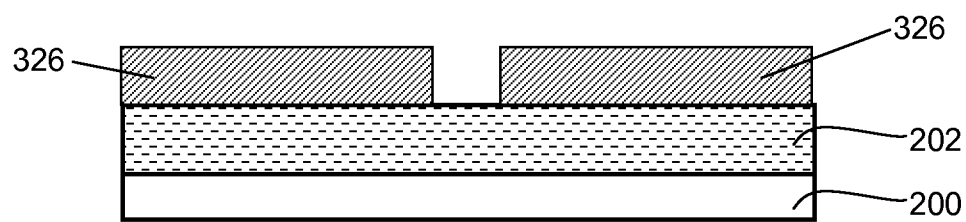

FIG. 3b is an illustration of the substrate 200 and the layers of FIG. 3a after developing the second layer 204 in an aqueous base solution to remove base soluble regions of the second layer and reveal at least one section of the underlying first layer 202 such as described in Step 130 above, according to another embodiment. A first relief image 326 is formed in the second layer. The first relief image 326 comprises the isolated pattern contained in the first patterned mask 320.

Figure 3C:
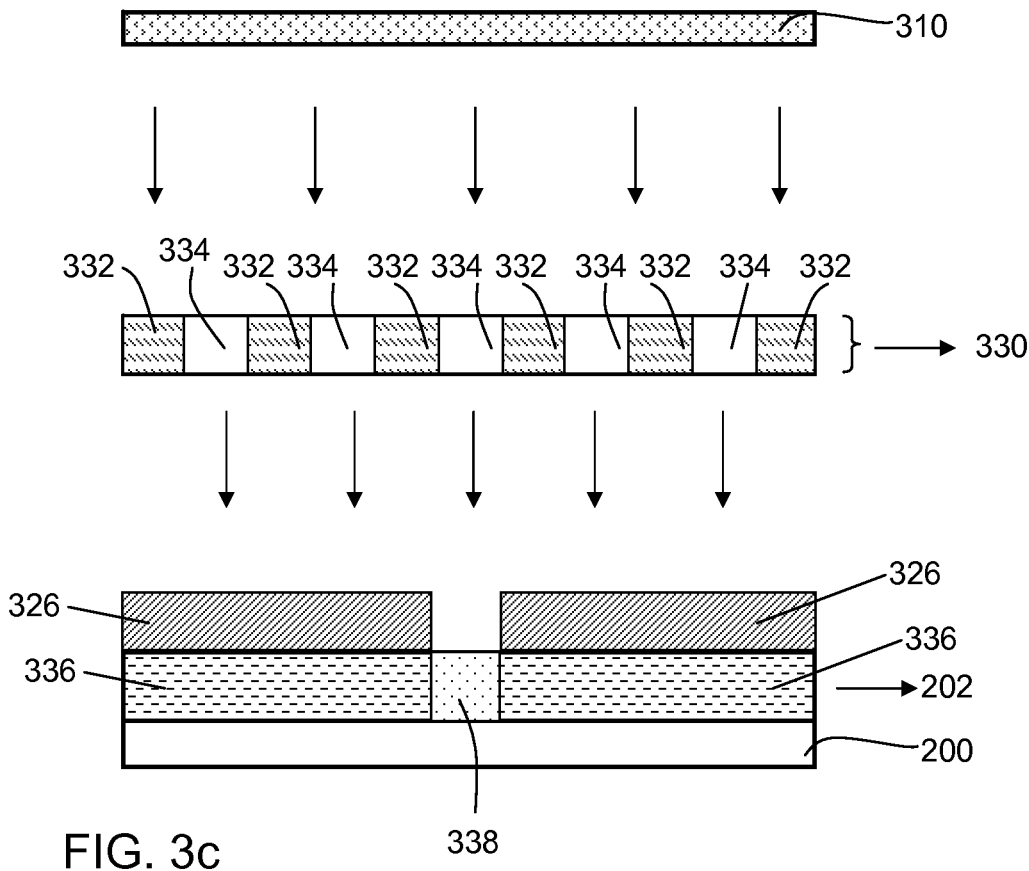

FIG. 3c illustrates the step of exposing the revealed section of the first layer to a second dose of the radiation 310 through a second patterned mask 330 such as described in Step 140 above, according to another embodiment. The second patterned mask 330 comprises a dense pattern in which masked sections 332 are essentially opaque to the radiation or impenetrable to the energetic particles, and unmasked sections 334 are essentially transparent to the radiation or penetrable to the energetic particles. Radiation or particles passing through the unmasked sections 334 may be transmitted to first relief image 326 and the revealed section of the first layer. Since the second layer 204 is absorbing at the wavelength of the radiation 310, most of the light may be blocked by the first relief image 326 and may not reach the underlying sections of the first layer 202. As a result, the radiation or particles may only induce the production of an acid in the exposed region 338 of the first layer 202. Blocked regions 336 of the first layer 202 may not produce an acid. Exposure to the radiation or energetic particles may render the exposed region 338 soluble in a base developer. The second patterned mask 330 and the first patterned mask 320 in FIG. 3a may have a same pattern feature but different pitches, i.e., the unmasked sections 334 of the second patterned mask 330 may have the same shape and size as the unmasked section 324 of the first patterned mask 320 in FIG. 3a. The first dose of the radiation may be lower than the second dose of the radiation.

Figure 3D:
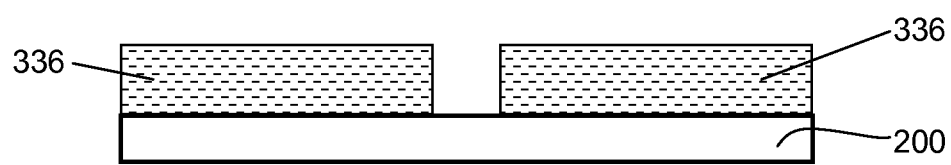

FIG. 3d is an illustration of the substrate 200 and the layers in FIG. 3c after the first relief image 326 and the base soluble region 338 are removed such as described in Step 150 above, according to another embodiment. A second relief image 336 is formed in the first layer after the removal. The second relief image 336 comprises the isolated pattern contained in the first patterned mask 320.

Figure 4:
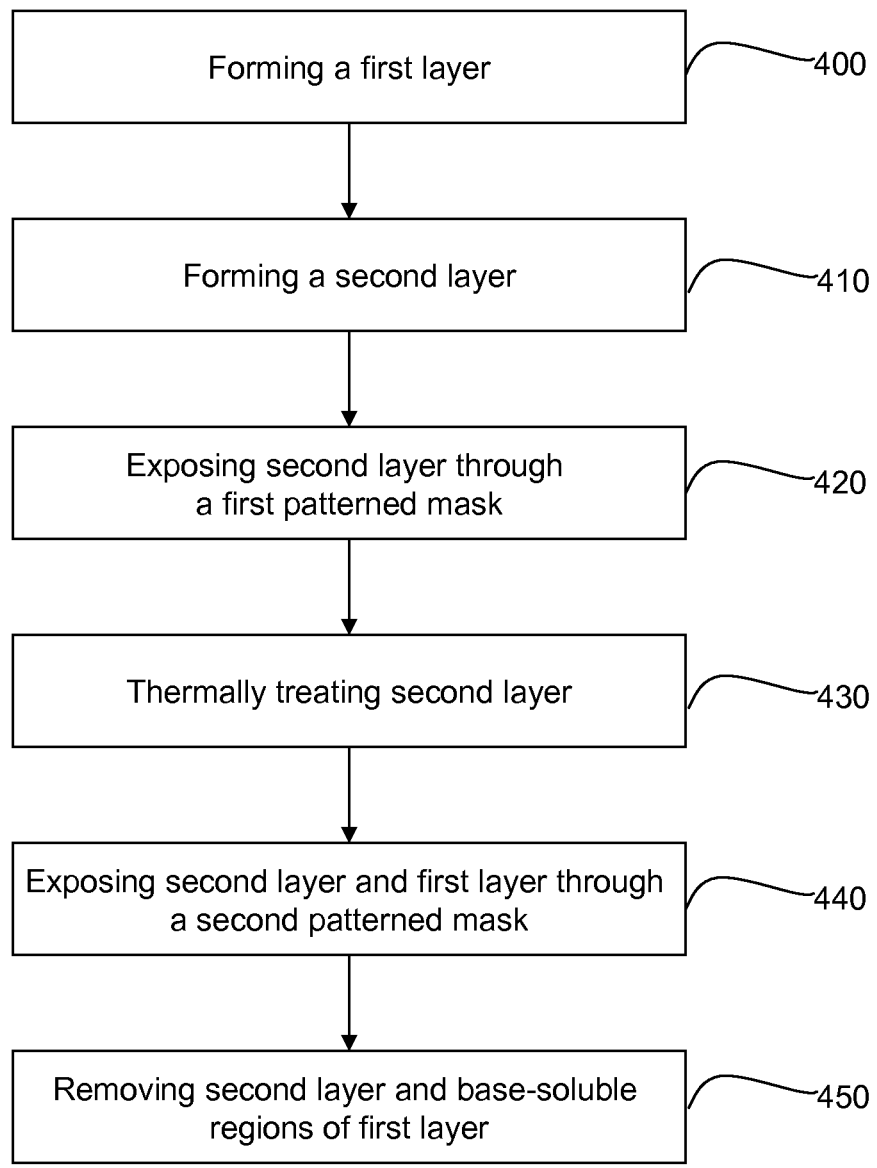
FIG. 4 is a flow chart illustrating a photolithography method, in accordance with embodiments of the present invention.

FIG. 4 is a flow chart illustrating a photolithography method. Step 400 comprises forming a first layer of a first photoresist over a substrate, such as described above for Step 100 of FIG. 1. The first photoresist may be any photoresist conventionally used in semiconductor industry, including 193 nm and 248 nm photoresists. Both positive-tone resists and negative-tone resists are suitable to be used in the present invention. The first photoresist is photosensitive to a radiation having an imaging wavelength. The first layer may be formed by virtually any standard means including spin coating. The substrate with the first layer may be baked (PAB) to remove any solvent from the first photoresist and improve the coherence of the first layer. The preferred range of the PAB temperature for the photoresist layer is from about 70° C. to about 150° C., more preferably from about 90° C. to about 130° C. The preferred range of thickness of the first layer is from about 20 nm to about 400 nm, more preferably from about 50 nm to about 300 nm.

Step 410 comprises forming a second layer of a second photoresist over the first layer. The second photoresist is a grey resist comprising a polymer containing an absorbing moiety which renders the polymer absorbing at the imaging wavelength of the radiation, as described above. Preferably, the grey resist comprises a polymer with an absorbing moiety which is cleavable upon exposure at the imaging wavelength of the radiation, thereby significantly reduces the absorption of the second layer at the exposure wavelength (referred to as "bleaching"). A PEB may be needed to cleave the absorbing moiety from the polymer. The absorbing moiety of the polymer of the grey resist may be any chemical moieties that absorb radiation at the exposure wavelength. Preferably, the absorbing moiety includes, but is not limited to, unsubstituted and substituted aromatic moieties such as benzene, naphthalene, hydroxy-substituted benzene, and hydroxy-substituted naphthalene.

The polymer of the grey resist preferably contains an acidic structure render the polymer soluble in an aqueous base solution. The acidic structure of the polymer includes, but is not limited to hexafluoroalcohol, phenol, fluorosulfonamide and carboxylic acid. In addition to the polymer, the bleachable barrier layer further comprises a photoacid generator and a solvent. Preferably, the grey resist also contains a base quencher.

The substrate may be baked (PAB) to remove any solvent from the second photoresist and improve the coherence of the second layer. The preferred range of the PAB temperature for the second layer is from about 70° C. to about 150° C., more preferably from about 90° C. to about 130° C. The preferred range of thickness of the second layer is from about 10 nm to about 300 nm, more preferably from about 20 nm to about 100 nm.

Step 420 comprises exposing the second layer to a first dose of the radiation through a first patterned mask. In one embodiment, the first patterned mask comprises a dense pattern. In another embodiment, the first patterned mask comprises an isolated or a semi-isolated pattern. Because the second layer is absorbing at the wavelength of the radiation, a large fraction of the first dose is absorbed by the second layer. As a result, only a small fraction of the first dose reaches the underlying first layer, which is not enough to induce any chemical reaction in the first photoresist.

In Step 430, the second layer is thermally treated at a first temperature to form bleached regions in the second layer. The bleached regions in the second layer may have substantially lower absorption than the unbleached regions of the second layer at the imaging wavelength of the radiation.

Step 440 comprises exposing the second and the first layers to a second dose of the radiation through a second patterned mask. A fraction of the radiation passes through at least one bleached region of the second layer, resulting in exposing at least one region of the first layer directly beneath the at least one bleached region of the second layer. When the first patterned mask comprises a dense pattern, then the second patterned mask comprises an isolated or a semi-isolated pattern. On the other hand, when the first patterned mask comprises an isolated or a semi-isolated pattern, then the second patterned mask comprises a dense pattern. It is preferred that the dense pattern and isolated or semi-isolated pattern have a same pattern feature, but different pitches.

Step 450 comprises removing the second layer and base soluble regions of the first layer to form a second relief in the first layer. The second relief image comprises the isolated or semi-isolated pattern contained in the first or the second patterned mask. It is preferred that the first relief image and base soluble regions of the first layer are removed in an aqueous base developer.

A PEB step may be performed after the first and second layers are exposed and before the second layer and base soluble regions of the first layer are removed. When the first photoresist is a positive-tone resist, the PEB step may induce a deprotection chemistry in the exposed regions of the first layer, rendering the exposed regions soluble in a base developer. When the first photoresist is a negative-tone resist, the PEB step may induce a crosslinking chemistry in the exposed regions of the first layer and render the exposed regions insoluble in a base developer. The preferred range of the PEB temperature is from about 70° C. to about 140° C., more preferably from about 90° C. to about 130° C.

Figure 5A:
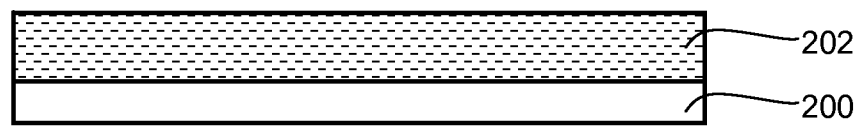
FIGS. 5a-5f illustrate exemplary processing steps of a photolithography method, in accordance with another embodiment of the present invention.
Figure 5B:
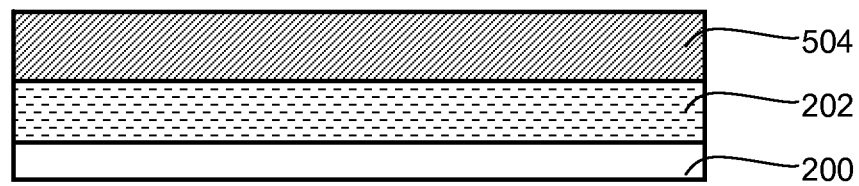

In FIG. 5a, a first photoresist is applied to a substrate 200 to form a first layer 202, such as described in FIG. 2a above. The first photoresist is photosensitive to a radiation having an imaging wavelength. FIG. 5b is an illustration of the substrate 200 after a second layer of a second photoresist 504 is formed over the first layer 202, such as described in Step 410 above. The second photoresist comprises a polymer containing an absorbing moiety rendering the polymer absorbing the radiation.

Figure 5C:
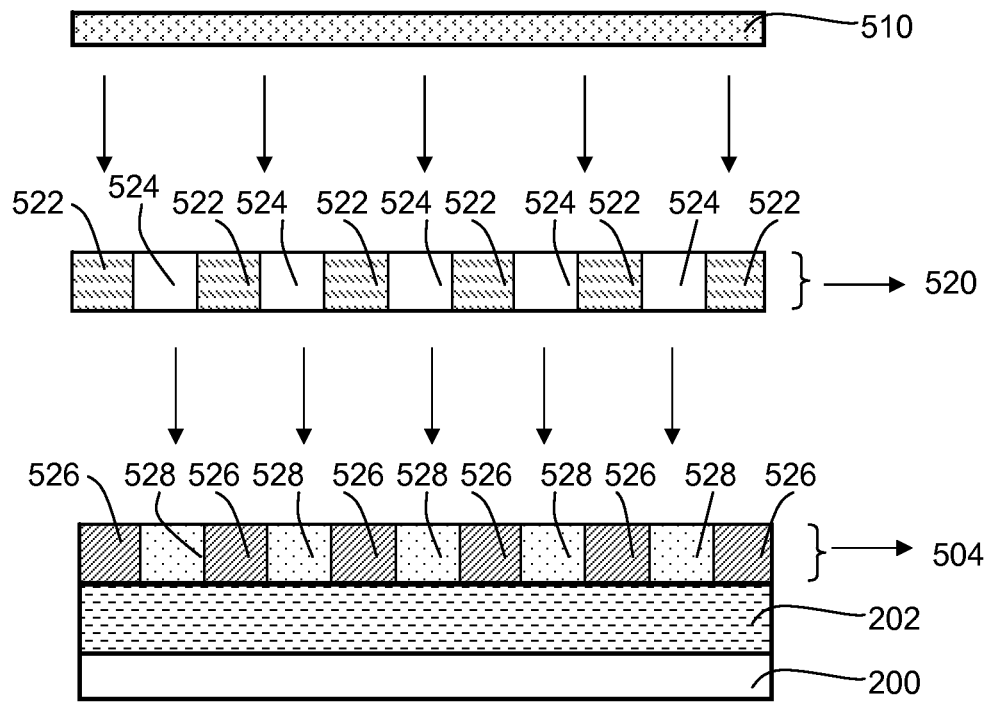

FIG. 5c illustrates the step of exposing the second layer 504 to a first dose of a radiation 510 through a first patterned mask 520 such as described in Step 420 above, according to one embodiment. The first patterned mask 520 comprises a dense pattern in which masked sections 522 are essentially opaque to the radiation or impenetrable to the energetic particles, and unmasked sections 524 are essentially transparent to the radiation or penetrable to the energetic particles. Radiation or particles passing through the unmasked sections 524 may be transmitted to the second layer 504 to be absorbed in the exposed regions 528 of the second layer 504, wherein the radiation or particles may induce the production of an acid in the exposed regions 528 of the second layer 504. Unexposed regions 526 of the second layer 504 may not produce an acid.

Figure 5D:
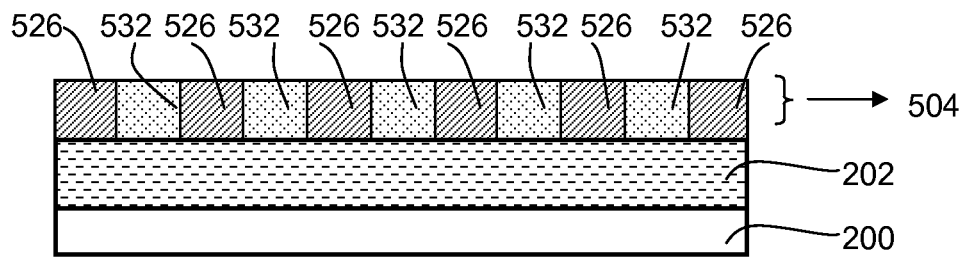

FIG. 5d is an illustration of the substrate 200 and the layers of FIG. 5c after thermally treating the second layer 504 such as described in Step 430 above, according to one embodiment. Bleached regions 532 are formed in the second layer 504 after the thermal treatment. The bleached regions 532 have substantially lower absorption than the unbleached regions 526 in the second layer 504 at the imaging wavelength of the radiation 510.

Figure 5E:
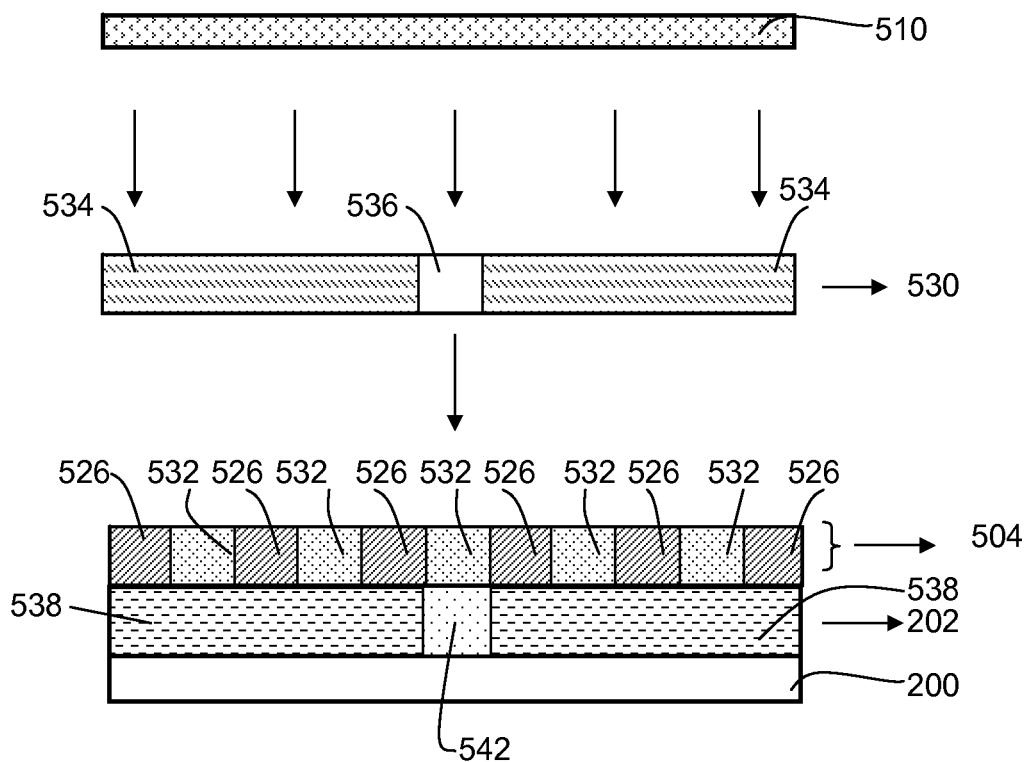

FIG. 5e illustrates the step of exposing the second and the first layers to a second dose of the radiation 510 through a second patterned mask 530 such as described in Step 440 above, according to one embodiment. The second patterned mask 530 comprises an isolated pattern in which masked sections 534 are essentially opaque to the radiation or impenetrable to the energetic particles, and an unmasked section 536 is essentially transparent to the radiation or penetrable to the energetic particles. Radiation passing through the unmasked section 536 may be transmitted to at least one bleached region 532 in the second layer 504. A fraction of the radiation transmitted may pass through the at least one bleached region 532 and result in exposing at least one region of the first layer 542, wherein the radiation may induce the production of an acid in the exposed region 542 of the first layer 202. Unexposed regions 538 of the first layer 202 may not produce an acid. Exposure to the radiation may render the exposed region 542 soluble in a base developer. The second patterned mask 530 and the first patterned mask 520 in FIG. 5c may have a same pattern feature but different pitches, i.e., the unmasked section 536 of the second patterned mask 530 may have the same shape and size as the unmasked sections 524 of the first patterned mask 520 in FIG. 5c. The first dose of the radiation may be lower than the second dose of the radiation.

Figure 5F:
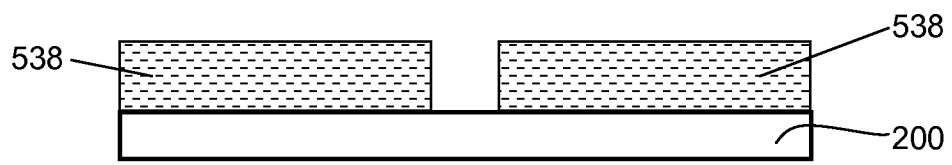

FIG. 5f is an illustration of the substrate 200 and the layers in FIG. 5e after the second layer 504 and the base soluble region 542 are removed such as described in Step 450 above, according to one embodiment. A second relief image 538 is formed in the first layer after the removal. The second relief image 538 comprises the isolated pattern contained in the second patterned mask 530.

Figure 6A:
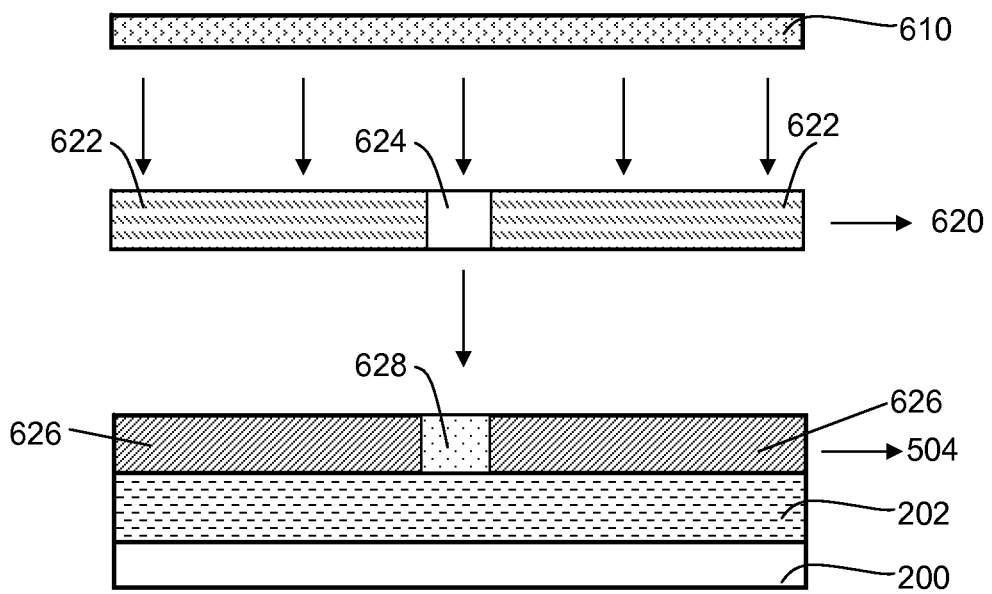
FIGS. 6a-6d illustrate exemplary processing steps of a photolithography method, in accordance with another embodiment of the present invention.

FIG. 6a illustrates the step of exposing the second layer 504 to a first dose of a radiation 610 through a first patterned mask 620 such as described in Step 420 above, according to another embodiment. The first patterned mask 620 comprises an isolated pattern in which masked sections 622 are essentially opaque to the radiation or impenetrable to the energetic particles, and an unmasked section 624 is essentially transparent to the radiation or penetrable to the energetic particles. Radiation or particles passing through the unmasked section 624 may be transmitted to the second layer 504 to be absorbed in the exposed region 628 of the second layer 504, wherein the radiation or particles may induce the production of an acid in the exposed region 628 of the second layer 504. Unexposed regions 626 of the second layer 504 may not produce an acid.

Figure 6B:
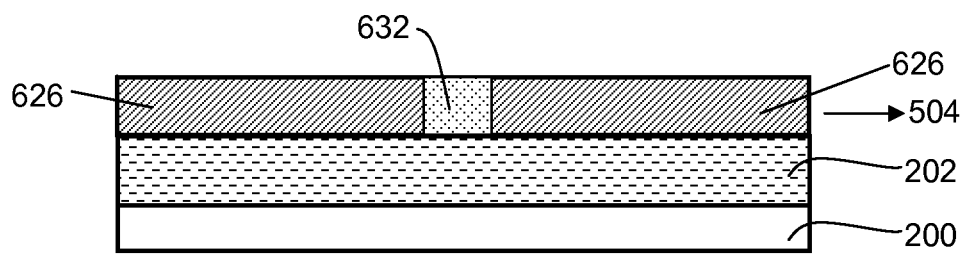

FIG. 6b is an illustration of the substrate 200 and the layers of FIG. 6a after thermally treating the second layer 504 such as described in Step 430 above, according to another embodiment. A bleached region 632 is formed in the second layer 504 after the thermal treatment. The bleached region 632 has a substantially lower absorption than the unbleached regions 626 in the second layer 504 at the imaging wavelength of the radiation 610.

Figure 6C:
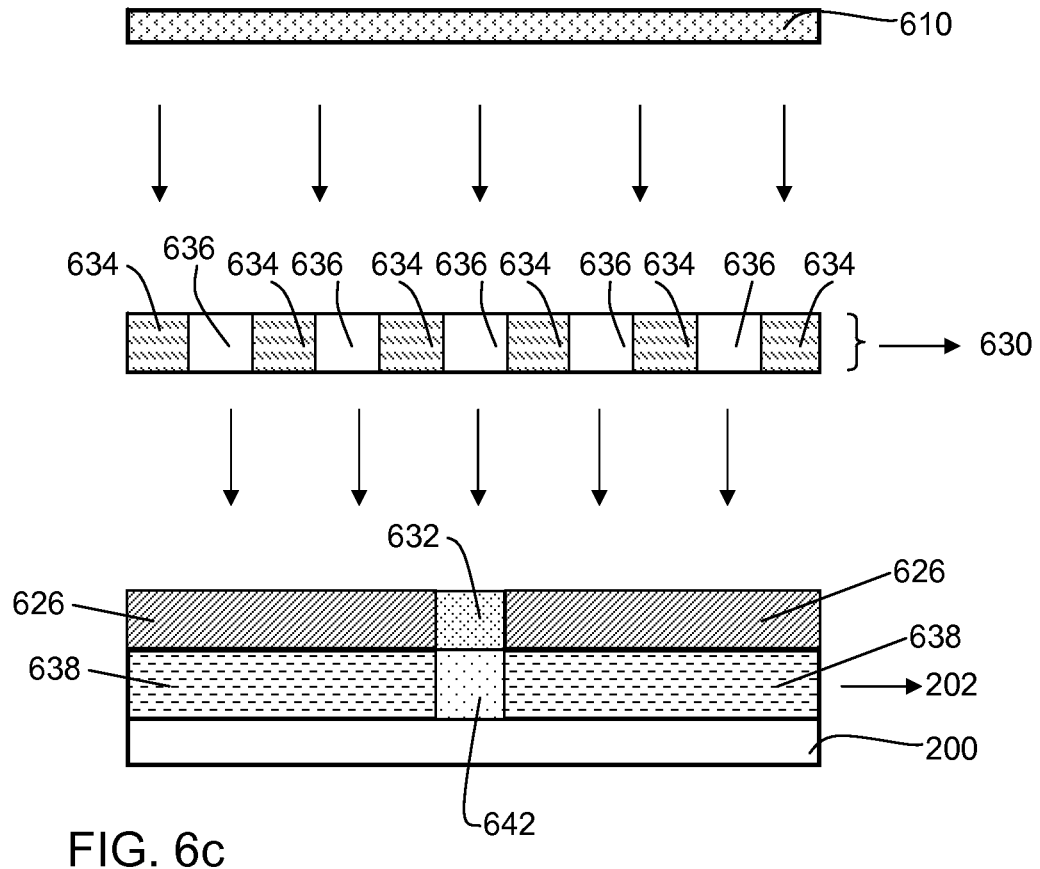

FIG. 6c illustrates the step of exposing the second and the first layers to a second dose of the radiation 610 through a second patterned mask 630 such as described in Step 440 above, according to another embodiment. The second patterned mask 630 comprises a dense pattern in which masked sections 634 are essentially opaque to the radiation or impenetrable to the energetic particles, and unmasked sections 636 are essentially transparent to the radiation or penetrable to the energetic particles. Radiation passing through the unmasked sections 636 may be transmitted to the second layer 504. A fraction of the radiation transmitted may pass through the at least one bleached region 632 and result in exposing at least one region of the first layer 642, wherein the radiation may induce the production of an acid in the exposed region 642 of the first layer 202. Regions 638 of the first layer 202 are beneath the unbleached regions 626 of the second layer, wherein most of the radiation is absorbed by the unbleached regions 626 and may not produce an acid. Exposure to the radiation may render the exposed region 642 soluble in a base developer. The second patterned mask 630 and the first patterned mask 620 in FIG. 6a may have a same pattern feature but different pitches, i.e., the unmasked sections 636 of the second patterned mask 630 may have the same shape and size as the unmasked section 624 of the first patterned mask 620 in FIG. 6a. The first dose of the radiation may be lower than the second dose of the radiation.

Figure 6D:
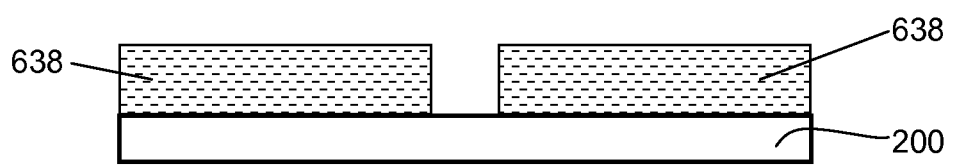

FIG. 6d is an illustration of the substrate 200 and the layers in FIG. 6c after the second layer 504 and the base soluble region 642 are removed such as described in Step 450 above, according to another embodiment. A second relief image 638 is formed in the first layer after the removal. The second relief image 638 comprises the isolated pattern contained in the first patterned mask 620.

The radiation employed in the present invention can be visible light, ultraviolet (UV), extreme ultraviolet (EUV) and electron beam (E-beam). It is preferred that the imaging wavelength of the radiation is about 248 nm, 193 nm or 13 nm. It is more preferred that the imaging wavelength of the radiation is about 193 nm. It is further preferred that the first dose of the radiation is lower than the second dose of the radiation.

The patterned masks employed in the present invention can be any photomasks commonly used in photolithographic processes including attenuated PSMs. The pattern feature on the patterned masks may include, but is not limited to, lines, trenches and contact holes.

It is preferred that the aqueous base solution or aqueous base developer is tetramethylammonium hydroxide (TMAH) solutions. It is further preferred that the concentration of the TMAH solutions is about 0.263 N. The aqueous base solution may further comprise additives, such as surfactants, polymers, isopropanol, ethanol, etc.

The second relief image in the first layer in the previous embodiments can be further transferred to the substrate by removing portions of the substrate not covered by the patterned photoresist layer. Typically, portions of the substrate are removed by reactive ion etching or some other technique known to one skilled in the art.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:
1. A photolithography method comprising:
   forming a first layer of a first photoresist over a substrate, said first photoresist is photosensitive to a radiation having an imaging wavelength;
   forming a second layer of a second photoresist over said first layer, said second photoresist comprising a polymer containing an absorbing moiety rendering said polymer absorbing said radiation;
   exposing said second layer to a first dose of said radiation through a first patterned mask, said first patterned mask comprising a dense pattern;
   developing said second layer in an aqueous base solution to remove base soluble regions of said second layer and reveal sections of said first layer, wherein a first relief image is formed in said second layer, said first relief image comprising said dense pattern;
   exposing at least one said revealed section of said first layer to a second dose of said radiation through a second patterned mask, wherein said second patterned mask comprises an isolated or a semi-isolated pattern;
   removing said first relief image and base soluble regions of said first layer to form a second relief image in said first layer, said second relief image comprising said isolated or semi-isolated pattern; and
   after said exposing said second layer and before said developing, baking said second layer at a first temperature, rendering at least one other region of said second layer substantially soluble in said aqueous base.

2. The method of claim 1, wherein said second layer has an absorption parameter (k) greater than the k parameter of said first layer at said imaging wavelength of said radiation.

3. The method of claim 2, wherein said absorption k parameter is in the range from about 0.05 to about 0.8 at said imaging wavelength of said radiation.

4. The method of claim 1, wherein said imaging wavelength of said radiation is about 193 nm.

5. The method of claim 1, wherein said first dose of said radiation is lower than said second dose of said radiation.

6. The method of claim 1, further comprising:
   after said removing, transferring said second relief image into said substrate.

7. A photolithography method comprising:
   forming a first layer of a first photoresist over a substrate, said first photoresist is photosensitive to a radiation having an imaging wavelength;
   forming a second layer of a second photoresist over said first layer, said second photoresist comprising a polymer containing an absorbing moiety rendering said polymer absorbing said radiation;
   exposing said second layer to a first dose of said radiation through a first patterned mask, said first patterned mask comprising an isolated or a semi-isolated pattern;
   developing said second layer in an aqueous base solution to remove base soluble regions of said second layer and reveal at least one section of said first layer, wherein a first relief image is formed in said second layer, said first relief image comprising said isolated or semi-isolated pattern;
   exposing said second layer and said revealed at least one section of said first layer to a second dose of said radiation through a second patterned mask, wherein said second patterned mask comprises a dense pattern;
   removing said first relief image and base soluble regions of said first layer to form a second relief image in said first layer, said second relief image comprising said isolated or semi-isolated pattern; and
   after said exposing said second layer and before said developing, baking said second layer at a first temperature, rendering said exposed at least one other region of said second layer substantially soluble in said aqueous base.

8. The method of claim 7, wherein said second layer has an absorption parameter (k) greater than the k parameter of said first layer at said imaging wavelength of said radiation.

9. The method of claim 8, wherein said absorption k parameter in the range from about 0.05 to about 0.8 at said imaging wavelength of said radiation.

10. The method of claim 7, wherein said imaging wavelength of said radiation is about 193 nm.

11. The method of claim 7, wherein said first dose of said radiation is lower than said second dose of said radiation.

12. A photolithography method comprising:
    forming a first layer of a first photoresist over a substrate, said first photoresist is photosensitive to a radiation having an imaging wavelength;
    forming a second layer of a second photoresist over said first layer, said second photoresist comprising a polymer containing an absorbing moiety rendering said polymer absorbing said radiation;
    exposing said second layer to a first dose of said radiation through a first patterned mask, said first patterned mask comprising a dense pattern;
    developing said second layer in an aqueous base solution to remove base soluble regions of said second layer and reveal sections of said first layer, wherein a first relief image is formed in said second layer, said first relief image comprising said dense pattern;
    exposing at least one said revealed section of said first layer to a second dose of said radiation through a second patterned mask, wherein said second patterned mask comprises an isolated or a semi-isolated pattern;
    removing said first relief image and base soluble regions of said first layer to form a second relief image in said first layer, said second relief image comprising said isolated or semi-isolated pattern; and
    after said exposing at least one said revealed section of said first layer and before said removing, baking said first layer at a second temperature, rendering at least one other region of said first layer substantially soluble in said aqueous base.

13. The method according to claim 12, wherein said dense pattern and said isolated or semi-isolated pattern have a same pattern feature, but different pitches.

14. A photolithography method comprising:
    forming a first layer of a first photoresist over a substrate, said first photoresist is photosensitive to a radiation having an imaging wavelength;
    forming a second layer of a second photoresist over said first layer, said second photoresist comprising a polymer containing an absorbing moiety rendering said polymer absorbing said radiation;
    exposing said second layer to a first dose of said radiation through a first patterned mask, said first patterned mask comprising an isolated or a semi-isolated pattern;
    developing said second layer in an aqueous base solution to remove base soluble regions of said second layer and reveal at least one section of said first layer, wherein a first relief image is formed in said second layer, said first relief image comprising said isolated or semi-isolated pattern;
    exposing said second layer and said revealed at least one section of said first layer to a second dose of said radiation through a second patterned mask, wherein said second patterned mask comprises a dense pattern;
    removing said first relief image and base soluble regions of said first layer to form a second relief image in said first layer, said second relief image comprising said dense pattern; and
    after said exposing said second layer and said revealed at least one section of said first layer and before said removing, baking said first layer at a second temperature, rendering said exposed at least one other region of said first layer substantially soluble in said aqueous base.

15. The method according to claim 14, wherein said dense pattern and said isolated or semi-isolated pattern have a same pattern feature, but different pitches.

* * * * *